US007964506B1

(12) United States Patent  (10) Patent No.: US 7,964,506 B1
Ponnuswamy et al.  (45) Date of Patent: Jun. 21, 2011

(54) TWO STEP COPPER ELECTROPLATING PROCESS WITH ANNEAL FOR UNIFORM ACROSS WAFER DEPOSITION AND VOID FREE FILLING ON RUTHENIUM COATED WAFERS

(75) Inventors: Thomas Ponnuswamy, Sherwood, OR (US); John Sukamto, Lake Oswego, OR (US); Jonathan Reid, Sherwood, OR (US); Steve Mayer, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 81 days.

(21) Appl. No.: 12/075,023

(22) Filed: Mar. 6, 2008

(51) Int. Cl.
*H01L 21/44* (2006.01)

(52) U.S. Cl. ......... 438/687; 257/E21.586; 257/E21.311; 257/E21.591

(58) Field of Classification Search .......... 438/584–688, 438/694–703; 257/E21.586
See application file for complete search history.

(56) References Cited

U.S. PATENT DOCUMENTS

| | | |
|---|---|---|
| 1,969,553 A | 8/1934 | Gernes |
| 3,652,442 A | 3/1972 | Powers et al. |
| 3,706,651 A | 12/1972 | Leland |
| 3,862,891 A | 1/1975 | Smith |
| 4,033,833 A | 7/1977 | Bestel et al. |
| 4,082,638 A | 4/1978 | Jumer |
| 4,240,886 A | 12/1980 | Hodges et al. |
| 4,272,335 A | 6/1981 | Combs |
| 4,304,641 A | 12/1981 | Grandia et al. |
| 4,357,220 A | 11/1982 | Eisenmann |
| 4,469,564 A | 9/1984 | Okinaka et al. |
| 4,604,177 A | 8/1986 | Sivilotti |
| 4,604,178 A | 8/1986 | Fleegener et al. |
| 4,605,482 A | 8/1986 | Shiragami et al. |
| 4,696,729 A | 9/1987 | Santini |
| 4,828,654 A | 5/1989 | Reed |
| 4,906,346 A | 3/1990 | Hadersbeck et al. |
| 4,931,149 A | 6/1990 | Stierman et al. |
| 4,933,061 A | 6/1990 | Kulkarni et al. |
| 5,039,381 A | 8/1991 | Mullarkey |
| 5,096,550 A | 3/1992 | Mayer et al. |
| 5,146,136 A | 9/1992 | Ogura et al. |
| 5,156,730 A | 10/1992 | Bhatt et al. |
| 5,162,079 A | 11/1992 | Brown |
| 5,217,586 A | 6/1993 | Datta et al. |

(Continued)

FOREIGN PATENT DOCUMENTS

EP 0037325 3/1981
(Continued)

OTHER PUBLICATIONS

U.S. Appl. No. 11/179,984, Mayer et al., *Rotationally Asymmetric Variable Electrode Correction*, filed Jul. 11, 2005, 51 pages.

(Continued)

*Primary Examiner* — Matthew C Landau
*Assistant Examiner* — Sonya D McCall Shepard

(57) ABSTRACT

A two-step semiconductor electroplating process deposits copper onto wafers coated with a semi-noble metal in manner that is uniform across the wafer and free of voids after a post electrofill anneal. A seed-layer plating bath nucleates copper uniformly and conformably at a high density in a very thin film using a unique pulsed waveform. The wafer is then annealed before a second bath fills the features. The seed-layer anneal improves adhesion and stability of the semi-noble to copper interface, and the resulting copper interconnect stays void-free after a post electrofill anneal.

29 Claims, 5 Drawing Sheets

U.S. PATENT DOCUMENTS

| | | | |
|---|---|---|---|
| 5,316,642 | A | 5/1994 | Young, Jr. et al. |
| 5,368,711 | A | 11/1994 | Poris |
| 5,391,285 | A | 2/1995 | Lytle et al. |
| 5,421,987 | A | 6/1995 | Tzanavaras et al. |
| 5,443,707 | A | 8/1995 | Mori |
| 5,472,592 | A | 12/1995 | Lowery |
| 5,476,578 | A | 12/1995 | Forand |
| 5,498,325 | A | 3/1996 | Nishimura et al. |
| 5,516,412 | A | 5/1996 | Andricacos et al. |
| 5,567,300 | A | 10/1996 | Datta et al. |
| 5,913,147 | A | 6/1999 | Dubin et al. |
| 5,935,402 | A | 8/1999 | Fanti |
| 5,982,606 | A | 11/1999 | Masuda et al. |
| 6,027,631 | A | 2/2000 | Broadbent |
| 6,113,771 | A * | 9/2000 | Landau et al. ............... 205/123 |
| 6,126,798 | A | 10/2000 | Reid et al. |
| 6,132,587 | A | 10/2000 | Jorne et al. |
| 6,136,707 | A | 10/2000 | Cohen |
| 6,179,983 | B1 | 1/2001 | Reid et al. |
| 6,193,860 | B1 | 2/2001 | Weling |
| 6,197,181 | B1 | 3/2001 | Chen |
| 6,297,157 | B1 * | 10/2001 | Lopatin et al. ............... 438/687 |
| 6,350,366 | B1 | 2/2002 | Landau et al. |
| 6,391,166 | B1 | 5/2002 | Wang |
| 6,395,152 | B1 | 5/2002 | Wang |
| 6,402,923 | B1 | 6/2002 | Mayer et al. |
| 6,497,801 | B1 | 12/2002 | Woodruff et al. |
| 6,527,920 | B1 | 3/2003 | Mayer et al. |
| 6,569,299 | B1 | 5/2003 | Reid et al. |
| 6,755,954 | B2 | 6/2004 | Mayer et al. |
| 6,773,571 | B1 | 8/2004 | Mayer et al. |
| 6,783,611 | B2 | 8/2004 | Yajima et al. |
| 6,800,187 | B1 | 10/2004 | Reid et al. |
| 7,682,498 | B1 | 3/2010 | Mayer et al. |
| 2002/0195352 | A1 | 12/2002 | Mayer et al. |
| 2003/0102210 | A1 | 6/2003 | Woodruff et al. |
| 2004/0061919 | A1 * | 4/2004 | Tench et al. ............... 359/265 |
| 2004/0065540 | A1 | 4/2004 | Mayer et al. |
| 2005/0006245 | A1 * | 1/2005 | Sun et al. ............... 205/291 |
| 2005/0009325 | A1 * | 1/2005 | Chung et al. ............... 438/637 |
| 2005/0173252 | A1 * | 8/2005 | Chen ............... 205/157 |
| 2006/0178007 | A1 * | 8/2006 | Nakamura et al. ............... 438/675 |
| 2006/0266655 | A1 * | 11/2006 | Sun et al. ............... 205/102 |
| 2009/0277867 | A1 | 11/2009 | Mayer et al. |
| 2009/0280649 | A1 | 11/2009 | Mayer et al. |
| 2010/0032304 | A1 | 2/2010 | Mayer et al. |

FOREIGN PATENT DOCUMENTS

| | | |
|---|---|---|
| JP | 59-162298 | 9/1984 |
| JP | 09-53197 | 2/1997 |
| JP | 2001316887 | 11/2001 |
| WO | WO/9941434 | 8/1999 |

OTHER PUBLICATIONS

Fang et al., "Uniform Copper Electroplating on Resistive Substrates," Abs. 167, 205$^{th}$ Meeting, © 2004 The Electrochemical Society, Inc., 1 page.

Oliver Chyan et al. "Electrodeposition of Copper Thin Film on Ruthenium", Journal of the Electochemical Society, 150 (5) pp. C347-C350 (2003).

Ken M. Takahashi "Electroplating Copper onto Resistive Barrier Films", Journal of the Electrochemical Society, 147(4) 1414-1417 (2000).

T.P. Hoar and J. N. Agar "Factors in Throwing Power Illustrated by Potential-Current Diagrams", Received Mar. 13, 1947.

"Damascene Cu Electroplating Chemistry", Handbook of Semiconductor Manufacturing Technology, © 2008 by Taylor & Francis Group, LLC.

W.A. Fairweather, "The Throwing Power of Acid Copper Plating Processes for Printed Circuit Boards", MS received May 10, 1983.

U.S. Office Action mailed Nov. 4, 2009 in U.S. Appl. No. 11/682,175.

U.S. Notice of Allowance and Allowed Claims mailed May 17, 2010 in U.S. Appl. No. 11/682,175.

Ponnuswamy et al., "Copper Electroplating Process For Uniform Across Wafer Deposition and Void Free Filling on Semi-Noble Metal Coated Wafers", U.S. Appl. No. 12/785,205, filed May 21, 2010.

* cited by examiner

TWO STEP COPPER ELECTROPLATING PROCESS WITH ANNEAL FOR UNIFORM ACROSS WAFER DEPOSITION AND VOID FREE FILLING ON RUTHENIUM COATED WAFERS

FIELD OF THE INVENTION

The present invention relates generally to methods and apparatus for depositing copper onto a wafer and more particularly to methods and apparatus for electroplating a copper seed layer on a semiconductor wafer. It is particularly useful for electroplating copper in damascene and dual damascene integrated circuit fabrication methods.

BACKGROUND OF THE INVENTION

Manufacturing of semiconductor devices commonly requires deposition of electrically conductive material on semiconductor wafers. The conductive material, such as copper, is often deposited by electroplating onto a seed layer of copper deposited onto the wafer surface by a PVD or CVD method. Electroplating is a method of choice for depositing metal into the vias and trenches of the processed wafer during damascene and dual damascene processing.

Damascene processing is used for forming interconnections on integrated circuits (ICs). Damascene processing involves formation of inlaid metal lines in trenches and vias formed in a dielectric layer (inter-metal dielectric). In a typical damascene process, a pattern of trenches and vias is etched in the dielectric layer of a semiconductor wafer substrate. A thin layer of diffusion-barrier film such as tantalum, tantalum nitride, or a TaN/Ta bi-layer is then deposited onto the wafer surface by a PVD method, followed by deposition of seed layer of copper on top of the diffusion-barrier layer. Typical materials for diffusion barrier layers include titanium (Ti), tantalum (Ta), tantalum nitride (TaN), tantalum nitride silicon (TaNSi), tungsten (W), titanium nitride (TiN), titanium nitride silicon (TiNSi) and the like.

The trenches and vias are filled with copper mostly commonly using an electroplating process. Because electroplating must occur on a conductive layer, a copper seed layer is first deposited on the diffusion barrier layer with CVD or PVD methods. Chemical vapor deposition (CVD) methods can deposit a conformal copper seed layer with good adhesion, but CVD methods are expensive as compared to PVD processes. Physical vapor deposition (PVD) methods can deposit a copper seed layer with good adhesion, but produces a less conformal film that covers the sidewalls and bottoms of trenches poorly. A thicker PVD seed layer is therefore required to ensure that an electrically conductive layer is provided for subsequent electroplating. The thicker PVD seed layer increases aspect ratios in features and may pinch off the gap opening, making the features harder or impossible to fill with an electroplating process.

As feature sizes decrease, the limitation of a PVD seed layer restricts how small metal lines can be. It is desirable to deposit a very thin copper seed film with good adhesion and conformality so that the aspect ratio of the remaining gap stays within a range that can be filled with an electroplating process. Accordingly, a method of such deposition, and an apparatus allowing practice of such a method, are needed.

SUMMARY

The present invention addresses these needs by providing a two-step semiconductor electroplating process that deposits a very thin and conformal copper seed film onto wafers coated with a semi-noble metal. The conformal copper seed layer is conductive enough for a bulk copper electrofilling of the trenches and vias with uniform and void-free bulk copper. The copper seed layer is annealed to strengthen and stabilize the copper/semi-noble metal interface before bulk copper electrofilling. After the trenches and vias are filled, the wafer is annealed again before planarization.

The semi-noble metal serves as all or a portion of the diffusion barrier used in Damascene processing. Electroplating in an appropriate plating bath nucleates copper uniformly and conformably at a high density in a very thin film. The resulting copper seed layer is thinner and more conformal than those produced using traditional PVD copper seed processes. A unique pulsed waveform may be employed to enhance the nucleation density and reduces resistivity of the very thin film deposited in the nucleation operation. After the copper seed layer is deposited, the seed layer is spun and dried, then treated by annealing.

It is believed that annealing the seed layer strengthens and stabilizes the copper/semi-noble metal interface. Non-uniform semi-noble metal coverage and/or non-uniform copper seed layer coverage can result in a weak interface. A weak interface results in void formation when the wafer undergoes stress during post electrofill anneal. The post electrofill anneal before planarization has been found to grow and stabilize grain structure in electroplated copper. Typical post electrofill anneal conditions range from about 100 to 225° C. for 90 seconds to 1 hour. The bulk copper after the post electrofill anneal planarizes, e.g., chemical mechanical polishing, at a consistent rate and has a lower resistance and better electromigration lifetimes. However, the post electrofill anneal can result in void formation if the copper seed layer is not annealed first.

The copper seed layer is annealed by subjecting the wafer to an annealing temperature for a period of time in the presence of a reducing atmosphere. The wafer is placed in an anneal station. The anneal station may be maintained at an annealing temperature of about 100 to 400° C., or about 100 to 200° C., or about 150° C. The wafer may be annealed for a period of between about 10 and 1000 seconds, between about 300-900 seconds, or about 120 seconds. Factors that affect the annealing temperature are annealing duration, thickness of the copper seed layer, roughness of the copper seed and underlying semi-noble metal layers. On the other hand, factors affecting the annealing duration include the annealing temperature, thickness of the copper seed layer, roughness of the copper seed layer and the underlying semi-noble metal layer. Additionally, the pressure and type of reducing environment may also affect the anneal process parameters. The reducing atmosphere is a non-oxidizing atmosphere and may be an atmosphere containing hydrogen, e.g., forming gas. The reducing atmosphere may be hydrogen plasma or other reducing plasma or atmospheres.

In one aspect, the present invention provides a semiconductor processing method for depositing copper. A semi-noble metal layer is deposited onto a semiconductor wafer. The semi-noble metal may be ruthenium, palladium, rhodium, iridium, osmium, cobalt, or nickel, and is preferably ruthenium. The semi-noble metal layer may be a portion of a diffusion barrier, or may be the diffusion barrier. A first plating bath deposits a seed layer of copper onto the semi-noble metal. The first plating bath nucleates copper uniformly and conformably at a high density in a very thin film. The first plating bath uses an electrolyte containing a copper salt and a copper complexing agent. It has a resistivity of at least 200 ohm cm, e.g., between about 200-5000 ohm cm, preferably at between about 400-4000 ohm cm, or even more preferably at between about 1000-2000 ohm cm. The deposited seed layer of copper is then annealed. Then a second plating bath may be employed to deposit a bulk-layer of copper onto the wafer containing the annealed seed layer. The first and the second copper deposition steps may be performed under conditions that reduce the terminal effect. Possible conditions include using a high resistivity virtual anode, a sheath, an electrically resistive element such as a plastic barrier with holes placed in the plating cell between the cathode and the anode, one or more azimuthally asymmetric anodes, baffles or plates that can direct cation flow, or a combination of these. The wafer may be spun and dried in between the copper depositions and after the bulk-layer deposition.

The wafer may be pretreated before any copper is deposited. The pretreatment may include annealing and optionally contact with a forming gas (nitrogen and up to 10% hydrogen). The wafer may be heated to about 100-400 degrees Celsius for a period of between about 1 and 5 minutes.

In certain embodiments, an electrolyte containing copper salts and a complexing agent is used in the first electroplating bath for the seed layer deposition. The copper salt may form large anions in the electrolyte solution. For example, possible copper salts include copper citrate, copper pyrophosphate, or copper oxalate. The complexing agent in the electrolyte may be ethylenediaminetetraacetic acid (EDTA), citrate, pyrophosphate, oxalate, or combinations of these. The electrolyte may be acidic with a pH of about 2-6. Specifically, the electrolyte may comprise EDTA at about 0.004-0.007M and copper citrate at 0.004-0.007M. In some cases, the electrolyte also contains a wetting agent.

In certain embodiments, during the seed layer deposition, the electrolyte causes a copper plating reaction to occur at a potential that is about 200-1000 millivolts more cathodic than would occur in a more conventional copper-plating electrolyte. In a specific embodiment, copper seed deposition takes place at a potential of about 0.8-2.0 volts. The seed layer may have a thickness of about 15-50 angstroms. The features on the wafer after the seed layer copper deposition may have an aspect ratio less than 15, preferably less than 10.

As indicated, a unique pulsed current waveform may be applied to the cathode and the anode. In some cases, the waveform has three sections, where substantially all of the copper is deposited in the third section. The first section applies a direct current for a first duration. The second section applies alternating forward and reverse currents, which deposits copper and then removes substantially all of the copper deposited. The third section applies another direct current waveform for a third duration. For example, using a 300 mm wafer, the first section applies a direct current of about 0.6-1.0 amps for a period of about 0.5-2 seconds. The second section include forward current pulses of about 0.6-0.9 amps for a period of about 700-1500 milliseconds and reverse current pulses of 0.2-0.5 amps for a period of 400-600 milliseconds. The second section may last about 8-15 seconds, consisting of up to 14 alternating pulse pairs. To deposit about 30-70 angstroms on a 300 mm wafer, the third section applies a direct current of about 0.6-1.0 amps for a period of 10-22 seconds.

After the copper seed layer is deposited, the wafer may be stored or annealed. Under ambient conditions, a layer of copper oxide forms on copper seed layers. When exposed to the acidic environment in the bulk electroplating solution, the copper oxide dissolves into the electroplating solution. This dissolution is undesirable because it removes a portion of the copper seed layer that is required for bulk electroplating and may render the copper seed layer discontinuous. By annealing the wafer in a reducing environment prior to the bulk electroplating, any copper oxide is reduced to copper metal. Thus less copper seed layer would dissolve on contact with the bulk electroplating solution and thus the copper seed layer continuity and uniformity is maintained. Note that it is desirable to perform the bulk electroplating immediately after the annealing so as to reduce the likelihood of any copper oxide formation.

In another aspect, the present invention pertains to a semiconductor processing apparatus. The apparatus may be a semiconductor processing tool containing one or more electroplating baths, one or more annealing stations, and one or more robots capable of transferring wafers. The apparatus includes a controller capable of executing a set of instructions. The set of instructions includes instructions for receiving the special electrolyte discussed above for the seed layer deposition, providing a wafer, electroplating copper onto the wafer, and annealing the wafer. The instructions may also include instructions for receiving a second electrolyte into a second bath for depositing the bulk-layer and electroplating the bulk-layer copper on a wafer in the second bath. The instructions may also include instructions for electroplating both layer in the same electroplating bath by removing the first electrolyte and receiving the second electrolyte before the bulk-layer deposition. The instructions may also include applying the current waveform as discussed above during the seed layer deposition.

In yet another aspect, the present invention pertains to a semiconductor metallization stack having interconnects. The layers in the sidewalls of the interconnect may be, in order from edge to center, a dielectric, a semi-noble metal, an annealed electroplated copper seed, and bulk copper layers. The annealed copper seed is 15-50 angstroms and is deposited using the electroplating process and electrolyte discussed above and then annealed. The layers may also include a layer of titanium (Ti), tantalum (Ta), tantalum nitride (TaN), tantalum nitride silicon (TaNSi), tungsten (W), titanium nitride (TiN), or titanium nitride silicon (TiNSi) in between the dielectric and the semi-noble metal, which may be ruthenium. The ruthenium may be deposited using a PVD, CVD or an ALD process. The sheet resistance of the annealed copper seed is less than that of the unannealed copper seed. The metallization stack does not form voids at the copper/ruthenium interface after a post electrofill anneal.

These and other features and advantages of the present invention will be described in more detail below with reference to the associated drawings.

DETAILED DESCRIPTION OF A PREFERRED EMBODIMENT

Introduction and Overview

Figure 1:
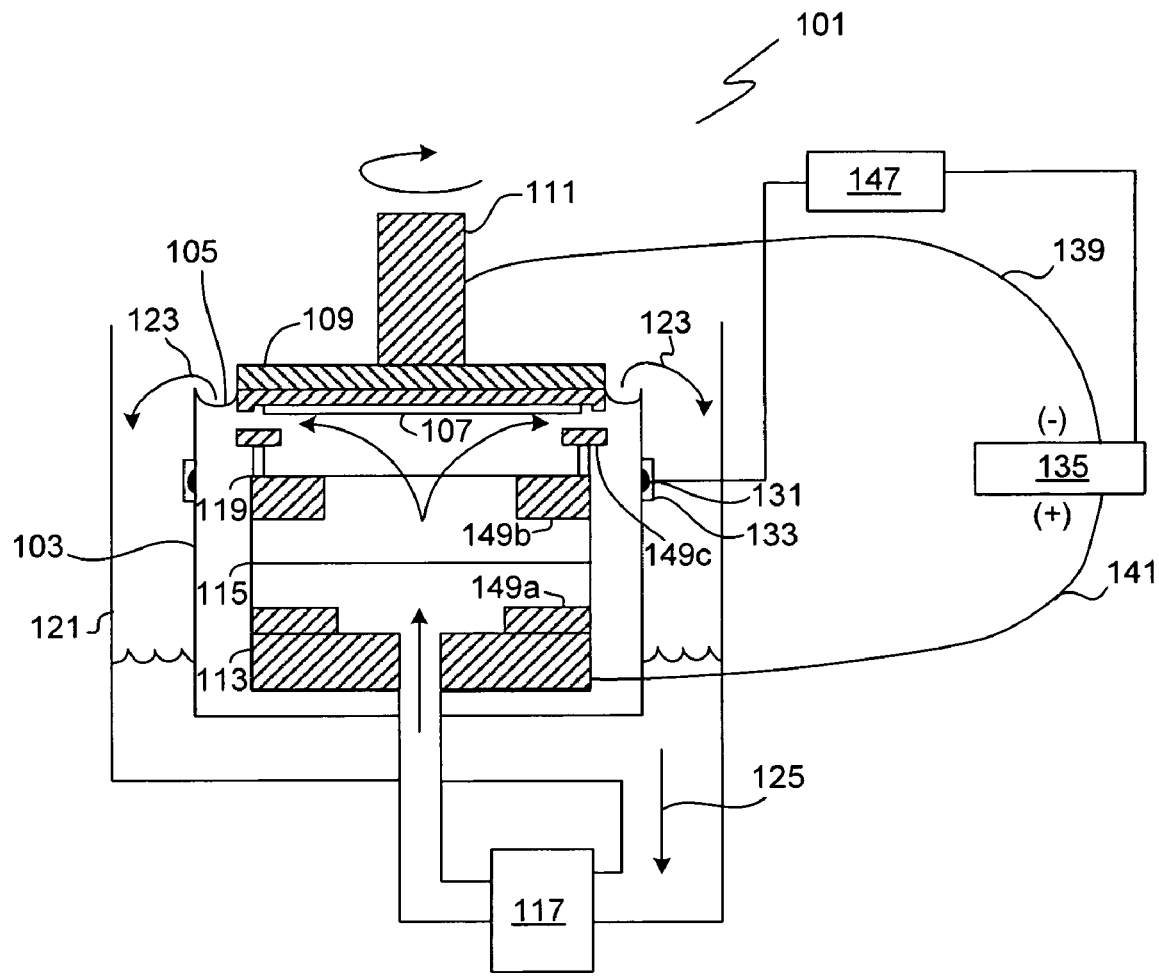
FIG. 1 is a diagrammatic cross-sectional view of one embodiment of an electroplating apparatus in accordance with the present invention.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

In this disclosure various terms are used to describe a semiconductor processing work surface, "wafer" and "substrate" are used interchangeably. The process of depositing, or plating, metal onto a conductive surface via an electrochemical reaction are referred to generally as electroplating or electrofilling. Bulk electrofilling refers to electroplating a relatively large amount of copper to fill trenches and vias.

As the on-chip interconnect wiring dimensions approach the 45 nm scale, barrier materials are occupying an increasing fraction of the area. This is highly undesirable due to the resulting increase in line resistance resulting from a decrease in total copper volume as well as possible overhang surrounding the via which causes the copper electrofill to pinch off and leave void defects in the features. In order to achieve finer features, the multi-layer structure must be simplified. As the aggressive scale down of feature sizes continues, there is an increasing demand for a new generation of diffusion barrier materials. Ideal candidates for future diffusion barriers should have good adhesion to both copper and dielectric layer, provide a conductive platform for copper plating and be completely immiscible with copper.

In addition to using new diffusion barrier materials, the copper seed layer process must also be altered in order to overcome the limitations of PVD seed layers. The basic requirements for a copper seed layer are continuous sidewall coverage, adequate opening dimensions at the top of the features so as to allow bottom-up filling during electroplating, and good adhesion to the barrier. The copper seed layer must have low enough resistance to enable subsequent bulk electroplating. Common problems with PVD seed layers include excessive pinch-off near the feature opening leading to voids near the center of features during bottom-up filling, and patchy discontinuous seed layers exposing oxidized Ta barrier onto which electroplating does not take place such that voids are formed along the sides of the features at the locations of exposed barrier.

An electroplating process can deposit a conformal and continuous copper seed layer onto a conductive surface, which is free of insulating oxides. Typical diffusion barrier layers such as tantalum and tantalum nitride have relatively high resistivity (around 220 $\mu\Omega$-cm) and in addition form highly stable oxides onto which electrodeposition of adherent densely nucleated films is difficult or impossible. Deposition of a conductive elemental layer that forms an oxide that is conductive, reducible to the metal, or soluble in the plating electrolyte has been explored as a means to overcome these problems. Ruthenium and other semi-noble metals, which have a resistivity of about 9 $\mu\Omega$-cm, may be deposited on a TaN layer to provide diffusion barrier/liners of relatively low resistivity and desirable oxide film properties. In some cases, ruthenium and other semi-noble metals may also be suitable as the barrier layer.

Even though ruthenium is more conductive than TaN, it is still much less conductive than a copper seed using a PVD process. For a thin ruthenium film, the sheet resistance is very high, at about 100-200 ohm/sq. The sheet resistance of the conductive layer increases as its thickness decreases. When the sheet resistance is high, a voltage drop exists between the edge of the wafer where electrical contact is made and the center of the wafer. This resistive drop persists during the electroplating process until sufficient plating increases the conductance across the wafer and reduces the voltage drop. The resistive drop results in a larger voltage driving the plating reaction near the edge of the wafer and thus a faster deposition rate at the wafer edge. As a result the deposited layer has a concave profile with an increased thickness near the edge of the wafer relative to its center. This terminal effect substantially increases the plated thickness near the wafer edge in substrates having seed layers or plated layers with sheet resistances greater than 1 Ohm/square, but will result in progressively greater edge thickness as sheet resistance increases further. The impact of terminal effect in generating thickness variation is mostly concentrated in the outer 15-30 mm of the wafer diameter, especially in substrates having thin seed layers. Therefore, copper deposition on ruthenium with conventional electroplating processes yield edge thick films due to this high resistance.

When plating on a high resistance surface, the electrolyte should ideally have low conductivity. When the bath conductivity is decreased the relative voltage drop between the wafer center and wafer edge compared to the overall voltage drop through the plating cell becomes small. The thickness distribution is improved because the voltage driving the reaction at the wafer edge is not much larger relative to that at the wafer center. The present invention uses a low conductivity (high resistivity) electrolyte that has, e.g., a resistivity higher than 200 ohm cm, preferably higher than about 1000 ohm cm, which is significantly higher than the conventional electroplating baths resistivity of between 2 and 20 ohm cm.

The Electroplating Process

First, general copper electroplating hardware and processes are discussed to provide context for further details of the present invention. Referring to FIG. 1, a diagrammatical cross-sectional view of an electroplating apparatus 101 is shown. The plating vessel 103 contains the plating solution, which is shown at a level 105. A wafer 107 is immersed into the plating solution and is held by, e.g., a "clamshell" holding fixture 109, mounted on a rotatable spindle 111, which allows rotation of clamshell 109 together with the wafer 107. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are incorporated herein by reference for all purposes. An anode 113 is disposed below the wafer within the plating bath 103 and is separated from the wafer region by a membrane 115, preferably an ion selective membrane. The region below the anodic membrane is often referred to as an "anode chamber." The ion-selective anode membrane 115 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes.

The plating solution is continuously provided to plating bath 103 by a pump 117. Generally, the plating solution flows upwards through an anode membrane 115 and a diffuser plate 119 to the center of wafer 107 and then radially outward and across wafer 107. The plating solution also may be provided into anodic region of the bath from the side of the plating cell 103. The plating solution then overflows plating bath 103 to an overflow reservoir 121 as indicated by arrows 123. The plating solution is then filtered (not shown) and returned to pump 117 as indicated by arrow 125 completing the recirculation of the plating solution. In certain configurations of the plating cell, a distinct electrolyte is circulated through the portion of the plating cell in which the anode is contained and mixing with the main plating solution is prevented using sparingly permeable membranes or ion selective membranes.

A reference electrode 131 is located on the outside of the plating vessel 103 in a separate chamber 133, which chamber is replenished by overflow from the main plating vessel. A reference electrode is typically employed when electroplating at a controlled potential is desired. The reference electrode may be one of a variety of commonly used types such as mercury/mercury sulfate, silver chloride, saturated calomel, or copper metal. In the context of this invention, voltages applied to the wafer are expressed relative to the copper metal reference electrode.

A DC power supply 135 can be used to control current flow to the wafer 107. The power supply 135 has a negative output lead 139 electrically connected to wafer 107 through one or more slip rings, brushes and contacts (not shown). The positive output lead 141 of power supply 135 is electrically connected to an anode 113 located in plating bath 103. The power supply 135 and a reference electrode 131 can be connected to a controller 147, which allows modulation of current and potential provided to the elements of electroplating cell. For example, the controller may allow electroplating either in galvanostatic (controlled current) or potentiostatic (controlled potential) regime. The controller may include program instructions specifying current and voltage levels that need to be applied to various elements of the plating cell, as well as times at which these levels need to be changed. For example, it may include program instructions for transitioning from forward current (depositing copper) to reverse current (removing copper) or from potential-control to current-control upon complete immersion of the wafer into the plating bath or at some later time.

During a forward current pulse, the power supply 135 biases the wafer 107 to have a negative potential relative to anode 113. This causes an electrical current to flow from anode 113 to the wafer 107, and an electrochemical reduction (e.g. $Cu2++2\ e^-=Cu^0$) occurs on the wafer surface (the cathode), which results in the deposition of the electrically conductive layer (e.g. copper) on the surfaces of the wafer. During a reverse current pulse, the opposite is true. The reaction on the wafer surface is an oxidation (e.g. $Cu^0 \rightarrow Cu2++2\ e^-$), which results in the removal of the copper.

The first electroplating of the process is discussed generally below. Details of the two-step cooper electroplating process may be found in U.S. patent application Ser. No. 11/682, 175, titled "TWO STEP PROCESS FOR UNIFORM ACROSS WAFER DEPOSITION AND VOID FREE FILLING ON RUTHENIUM COATED WAFERS," filed on Mar. 5, 2007, the disclosure of which is hereby incorporated by reference in its entirety for all purposes.

Electroplating the Copper Seed

As discussed above, deposition thickness varies between the edge and the center of the wafer when electroplating onto a thin film having a high sheet resistance. Ways to reduce the terminal effect includes different configurations of the plating apparatus, discussed in more detail in the bulk electroplating section. These hardware configurations also may be used during the seed layer deposition. Yet another way to decrease this effect is to increase the resistivity of the electrolyte so that the relative change in potential between the wafer center and wafer edge compared to the overall potential drop through the plating cell becomes small. A special electrolyte, therefore, is required for plating a seed layer of copper onto a ruthenium-coated wafer.

Copper plating electrolytes commonly use a copper salt as ion source. The anions from the salt used can contribute significantly to conductivity of the solution. One factor affecting the conductivity of the electrolyte is the mobility of the ions. A copper salt having larger ions in solution would be less mobile, and the solution less conductive. Suitable salts include copper citrate ($Cu_3(C_6H_5O_7)_2$), copper pyrophosphate ($Cu_2P_2O_7$), and copper oxalate ($CuC_2O_4$). In general, molecular ions which are highly hydrated or which have more than 6 non-hydrogen atoms are sufficiently large to reduce the mobility of the ion in solution and are considered sufficiently large to reduce the conductivity of the electrolyte compared to the effect of equivalent concentration of small highly mobile ions such as hydrogen.

In certain embodiments, the copper seed electrolyte in accordance with the present invention has a resistivity of greater than 200 ohm cm, or a conductivity less than 5 milliSiemens. Preferably, the resistivity is 200-5000 ohm cm, or more preferably, 400-4000 ohm cm, or even more preferably, 1000-2000 ohm cm. One skilled in the art will readily be able to choose a resistivity that allows a thickness distribution within a uniformity requirement on a given ruthenium film resistance using particular hardware configurations. A common uniformity requirement of thickness difference between the edge and the center of the wafer is a range of +/−10%, preferably less than +/−5%.

The electrolyte also includes one or more copper complexing agents. Complexing agents are additives that bind the copper cation in solution, thereby increasing the degree of polarization, or the potential required to reduce the cupric ion to metal. It is believed that the copper nucleation and growth mode is sensitive to the oxidation state of the ruthenium surface. Because ruthenium is deposited in a different process (PVD or ALD) on different semiconductor processing tools, the surface is usually covered with an air-formed oxide film. Failure to remove the air-formed 3D oxide film may result in Volmer-Weber (island) growth on the surface. In order to achieve continuous copper nucleation in the electroplating bath, the surface film must be removed by polarization at negative potentials typically in or approaching the hydrogen evolution region.

A suitable complexing agent is ethylenediaminetetraacetic acid (EDTA). EDTA is a hexadentate (six-toothed) ligand, i.e. it has 6 lone pairs of electrons all of which can form coordinate bonds with the same metal ion. EDTA forms extremely stable complexes with divalent metal cations using all of its complexing sites that give rise to a cage-like structure in which the cation is effectively surrounded by and isolated from solvent molecules. A consequence of the stronger complexing ability of EDTA is that a larger cathodic potential is required for the reduction of cupric ions to copper metal (range of 0.8 V to 1.8 V). Such extreme negative copper reduction potential may also reduce the oxide film on ruthenium resulting in continuous nucleation on the surface. If the electrolyte contains no complexing agent, copper will deposit at much lower cathodic potentials (0.6 V). The oxide film will not be removed and poor nucleation would result with the attending effect of rapid growth on initially formed nuclei. Therefore, the plating reaction in accordance with the present invention deposits copper at a potential that is 0.2-1 V more cathodic than would occur in a conventional copper-plating electrolyte.

Other suitable complexing agents include citrate, pyrophosphate, oxalate, and a combination of the aforementioned complexing agents. Incorporating these complexing agents would also increase the cathodic potential and thereby remove the oxide film on ruthenium. Other complexing agents include triethanolamine, dimercaptosuccinic acid, nitrilotriacetate, dimercaprol, and desfuroxamine mesylate. Using the electrolyte as described, the copper plating reaction occurs at a cathodic potential of about 0.8 to 2.0 V.

In some embodiments, the electrolyte comprises 0.004-0.007M EDTA and 0.004-0.007M copper citrate. The electrolyte may have a pH of about 2-6. In some embodiments, the electrolyte also includes a wetting agent.

During the seed copper deposition, the power supply 135 applies a direct current to flow between the anode 113 and the wafer 107. In some embodiments, the current waveform has three sections or regimes. The first section is a forward current pulse of a first current for a first duration. The second section is pairs of alternating forward and reverse current pulses for a second duration. The third section is another forward current pulse for a third duration.

During the first section, some copper is plated onto the wafer. During the second section, copper is alternatively plated onto the wafer and removed from the wafer. It is found that this alternating deposition and removal greatly improves nucleation and coverage. The better coverage reduces the resistivity of a given thickness of copper deposited. During the removal pulse in a pulse pair, substantially all of the copper deposited during the forward pulse is removed (e.g., at least 50% or at least 80% of the previously deposited copper). One skilled in the art will be able to select a waveform that achieves this goal while taking into account the differences between current efficiency of the forward and reverse current pulses. In general, the forward current (deposition) is less efficient than the reverse current (removal). Care also must be taken not to over polish the surface.

After the second step, the wafer may have little or no copper deposited, as each pulse pair removes the copper it deposits. Substantially all of the copper seed layer is deposited during the third regime. In the third regime, a forward current is applied for a third duration to deposit the 15-60 angstrom seed film thickness.

Figure 2:
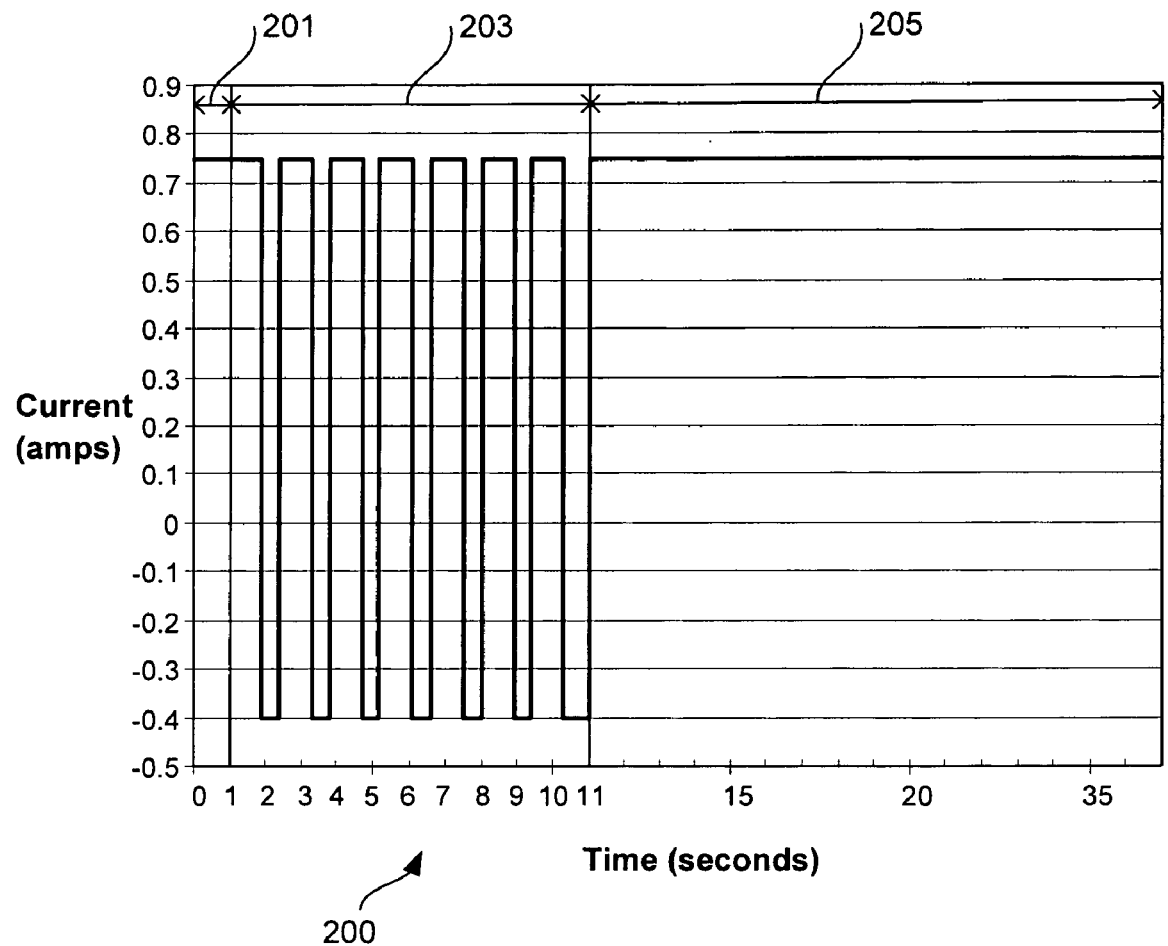
FIG. 2 is a diagram of one embodiment of the current waveform applied during the copper seed layer electroplating process.

In some 300 mm embodiments as shown in FIG. 2, in the first step 201, the forward current may be about 0.6-1.0 amps for a period of about 0.5-2 seconds. The second step 203 may include forward current pulses of between about 0.6-0.9 amps for a period of about 700-1500 milliseconds and include reverse current pulses of between about 0.2-0.5 amps for a period of about 400-600 milliseconds. The entire duration of the second step may be 8-15 seconds, for a total of about 5-15 pulse pairs. In the third step 205, the current may be about 0.6-1.0 amps for a period of about 10-22 seconds. Depending on the thickness of the seed layer required, one skilled in the art would determine the appropriate duration given the current flow and other electroplating process parameters.

Although a three-section waveform is described, this invention is not limited to such a waveform. For example, a waveform with fewer or more sections may be applied, with or without a section of forward and reverse pulse pairs. Thus, a much simpler waveform having only forward direct current may be used.

As discussed above, a thin conformal copper film between about 15 and 60 angstroms may be deposited as the seed layer. The minimum thickness is determined by the need to have continuous coverage on the ruthenium surface and the need to avoid full oxidation of the copper seed layer before the bulk-plating step. The second factor may be controlled by reducing the time between the seed and bulk plating step and the exposure to oxygen in the environment in between electroplating steps. Additionally, the sheet resistance also affects the minimum thickness. If the sheet resistance becomes too high the bulk electroplating may not be possible. The maximum thickness depends on the geometry of the features on the wafer. A reasonably low aspect ratio is required prior to the bulk plating. Generally, an aspect ratio of less than 15, preferably less than 10, is required prior to the bulk plating. A higher aspect ratio increases the probability that a feature opening would be pinched off leaving unfilled voids. The ability to deposit very thin seed layers onto very thin barrier layers enables filling of features 25 nm and below. A separate bulk layer electroplating is necessary because the seed layer deposition is very slow.

Annealing the Copper Seed Layer

Figure 5A:
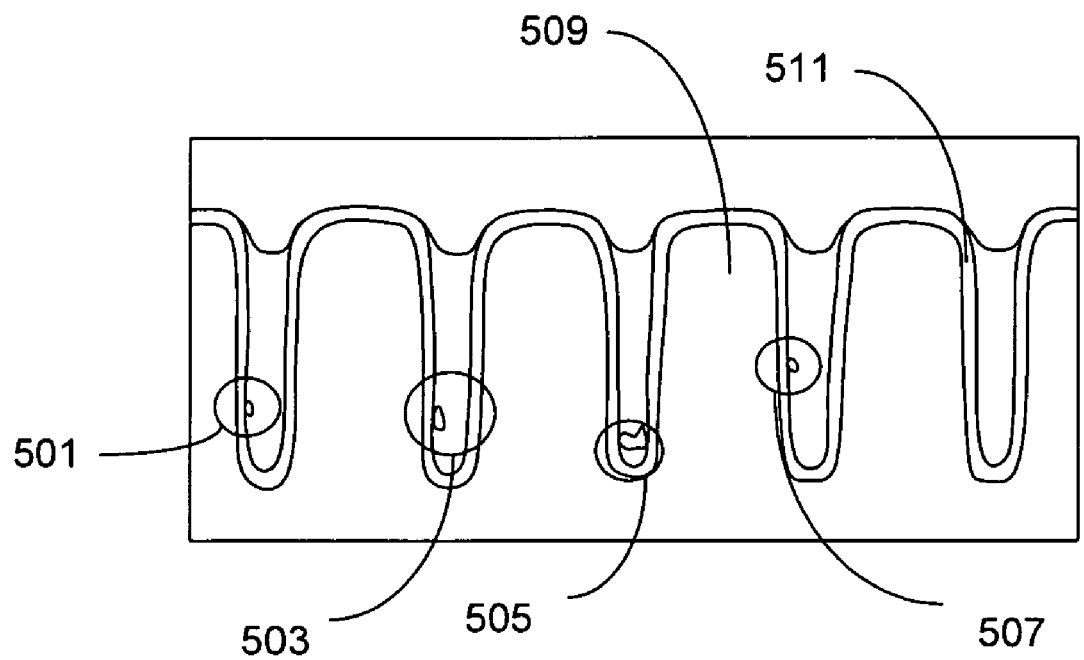
FIGS. 5A and 5B are a graphical representation of SEM photos copper metallization stacks after a post electrofill anneal of stacks including annealed copper seed and unannealed copper seed layers.

After the copper seed layer is deposited, it is annealed before a bulk layer is electroplated to fill the features. The bulk layer is typically annealed before planarizing the bulk copper. The post electrofill anneal has been found to grow and stabilize grain structure in electroplated copper. Typical post electrofill anneal conditions range from about 100 to 225° C. for 90 seconds to 1 hour. The bulk copper after the post electrofill anneal planarizes, e.g., chemical mechanical polishing, at a consistent rate and has a lower resistance and better electromigration lifetimes. However, the post electrofill anneal can result in void formation. The post electrofill anneal stresses the electroplated copper and causes voids to form at the copper-ruthenium interface. FIG. 5A is a graphical representation of a SEM photo of such voids, 501, 503, 505, and 507. These examples of voids are located at different places in the feature and have different sizes and shapes, but all of them appear to be formed at a copper-ruthenium interface.

The copper electroplating process includes an optional step of pretreating a ruthenium-coated wafer by annealing before any electroplating takes place. Because the wafer may be already annealed before (pretreatment) and after electroplating (post electrofill anneal), an additional anneal after the copper seed layer electroplating was not considered. In most cases, the wafer is transferred directly to the bulk-electroplating module immediately after the seed layer deposition. In some cases, the wafers are stored. Under ambient conditions after some time, a layer of copper oxide forms on exposed copper surface. When exposed to the acidic environment in the bulk electroplating solution, the copper oxide dissolves into the electroplating solution. This dissolution is undesirable because it removes a portion of the copper seed layer that may render the copper seed layer discontinuous or bulk electroplating more difficult. By annealing the wafer in a reducing environment prior to the bulk electroplating, any copper oxide can be potentially reduced to copper metal. Thus less copper seed layer would dissolve on contact with the bulk electroplating solution and thus the copper seed layer continuity and uniformity is maintained. Note that it is desirable to perform the bulk electroplating immediately after the annealing so as to reduce the likelihood of any copper oxide formation. However, the benefits of copper oxide reduction may be derived with a shorter anneal than that is required to strengthen the copper-ruthenium interface.

The inventors unexpectedly found that a post copper seed layer anneal reduces or eliminates the voids formed after a post electrofill anneal. Though not intending to be bound by this theory, it is believed that annealing the seed layer strengthens and stabilizes the copper/semi-noble metal interface. Non-uniform or rough semi-noble metal coverage and/or non-uniform copper seed layer coverage can result in a weak interface, and a weak interface results in void formation when the wafer undergoes stress during post electrofill anneal. Note that the copper oxide reduction and copper-ruthenium interface stabilization anneals do not need to have the same process requirements. Anneal conditions for achieving the copper oxide reduction may not produce enough interface strengthening.

The copper seed layer is annealed by subjecting the wafer to an annealing temperature for a period of time in the presence of a reducing atmosphere. The wafer is placed in an anneal station. The anneal station may be maintained at an annealing temperature of about 100 to 400° C., or about 100 to 200° C., or about 150° C. The wafer may be annealed for a period of between about 10 and 1000 seconds, between about 300-900 seconds, or about 120 seconds. Factors that affect the annealing temperature are annealing duration, thickness of the copper seed layer, and roughness of the copper seed and underlying semi-noble metal layers. On the other hand, factors affecting the annealing duration include the annealing temperature, thickness of the copper seed layer, roughness of the copper seed layer and the underlying semi-noble metal layer. In one example, a copper seed film anneals at a temperature of 180° C. for two minutes. In another example, a copper seed film may be annealed at 225° C. for 90 seconds. In yet another example, a copper seed film may be annealed at 150° C. for 15 minutes. Manufacturing conditions may favor shorter anneals, and a thermal budget or specific partially fabricated semiconductor device may favor cooler anneals. For example, some low k dielectric properties may be affected by anneal temperatures greater than about 250° C.

Additionally, the pressure and type of reducing environment may also affect the anneal process parameters. The reducing atmosphere is a non-oxidizing atmosphere and may be an atmosphere containing hydrogen, e.g., forming gas. The reducing atmosphere may be hydrogen plasma or other reducing plasma or atmospheres. Forming gas may include up to 10% hydrogen and nitrogen. Other inert gas such as argon may be mixed with hydrogen to the same effect.

Electroplating a Bulk Layer to Fill the Features

Copper plating to fill the features is made more difficult by the very thin seed layer. As discussed above, very thin films have higher sheet resistance that produces a terminal effect under conventional copper electroplating conditions. The present invention involves a bulk-electroplating operations performed under conditions that reduce the terminal effect. These conditions may include modifications of electrolyte composition and introduction of new configurations of the plating apparatus.

In general, in order to achieve a uniform thickness distribution of plated copper on the wafer surface a uniform voltage profile should exist at the wafer surface during plating. In order to compensate for the terminal effect, it is necessary to compensate for the resistive voltage drop by increasing the voltage or current supplied to the inner regions of the wafer so that an equivalent interfacial potential is maintained across the full wafer surface. Alternatively, one may choose a shape of the anode chamber opening to match the plated wafer surface while adjusting for increased current flux to the edge of the wafer with shielding near the wafer edge.

The plating solution is typically composed of copper sulfate, sulfuric acid, chloride ions and organic additives. Sulfuric acid is added to the electrolyte to enhance conductivity of the plating solution. This allows electroplating at reduced applied voltages and improves uniformity of voltage applied to surfaces at varying distances from an anode. Uniform voltages lead to uniform deposition rates. Conversely, when anode and wafer are equidistant at all points, lower concentrations of acid can be used to uniformly increase resistance between the wafer and the anode. This large uniform increase in resistance can diminish the terminal effect of resistive seed layers. Therefore, it is preferred to use electrolytes with low or medium concentrations of sulfuric acid while plating on thin seed layers. Another method to increase the resistance of the electrolyte may be to use salts that form large anions in solution, discussed above.

A number of electroplating apparatus configurations have been developed in order to improve the uniformity of electroplating. These configurations include shielding, dynamic shielding, anode configurations, and second cathode configurations. Shielding involves positioning dielectric material between the anode and the wafer cathode. The dielectric inserts, known as sheaths and shields, can have a variety of geometries allowing them to block the current flow between the anode and the wafer over a portion of the edge of the wafer. The shielding may be dynamic. Dynamic shielding involves movement of an iris like mechanism to divert current toward the center of the wafer as needed to compensate for terminal effect or to achieve specific profile shaping. Various field shaping methods and apparatus are described in U.S. Pat. No. 6,402,923, "Method and Apparatus for Uniform Electroplating of Integrated Circuits Using a Variable Field Shaping Element", Mayer et. al., issued Jun. 11, 2002, which is incorporated herein by reference for all purposes.

A resistive element inserted close to a wafer surface and varying resistivity through the element may also modulate thickness distribution across the wafer. High resistivity virtual anodes are described in U.S. Pat. No. 6,773,571 issued Aug. 10, 2004, titled "Method And Apparatus For Uniform Electroplating Of Thin Metal Seeded Wafer Using Multiple Segmented Virtual Anode Sources" by Mayer et al., incorporated herein by reference for all purposes.

In particular, dielectric plates with hole patterns placed near the wafer surface as a means to modulate the resistive pathway between the anode and the wafer were described in U.S. Pat. No. 6,179,983 issued Jan. 30, 2001 to Reid et al., titled "Method And Apparatus For Treating Surface Including Virtual Anode," which is incorporated by reference herein for all purposes. Use of segmented anodes with dynamic control has also been described as a means to divert current towards either the center or the edge of a wafer. Azimuthally asymmetric anodes are described in U.S. patent application Ser. No. 11/179,984 filed Jul. 11, 2005 by Mayer et al., titled "Rotationally Asymmetric Variable Electrode Correction," which is also incorporated by reference herein for all purposes.

Yet another apparatus configuration to reduce the terminal effect is a second cathode located remotely with respect to the wafer. The remotely positioned second cathode allows modulation of current density at the wafer surface by diverting a portion of current flow from the near-edge region of the wafer to improve the uniformity of the plated layer.

Any of the modifications of electrolyte composition and new configurations of the plating apparatus may be used for the bulk electroplating on a wafer having a ruthenium coating and an electroplated seed. Particularly, combinations of the above configurations and electrolyte compositions may be effective. In one embodiment, low acid electrolyte chemistry was used with hardware configurations including high resistance virtual anode, dual cathode, and various dielectric inserts in the plating bath to shape the current field.

Process Flow

Figure 3:
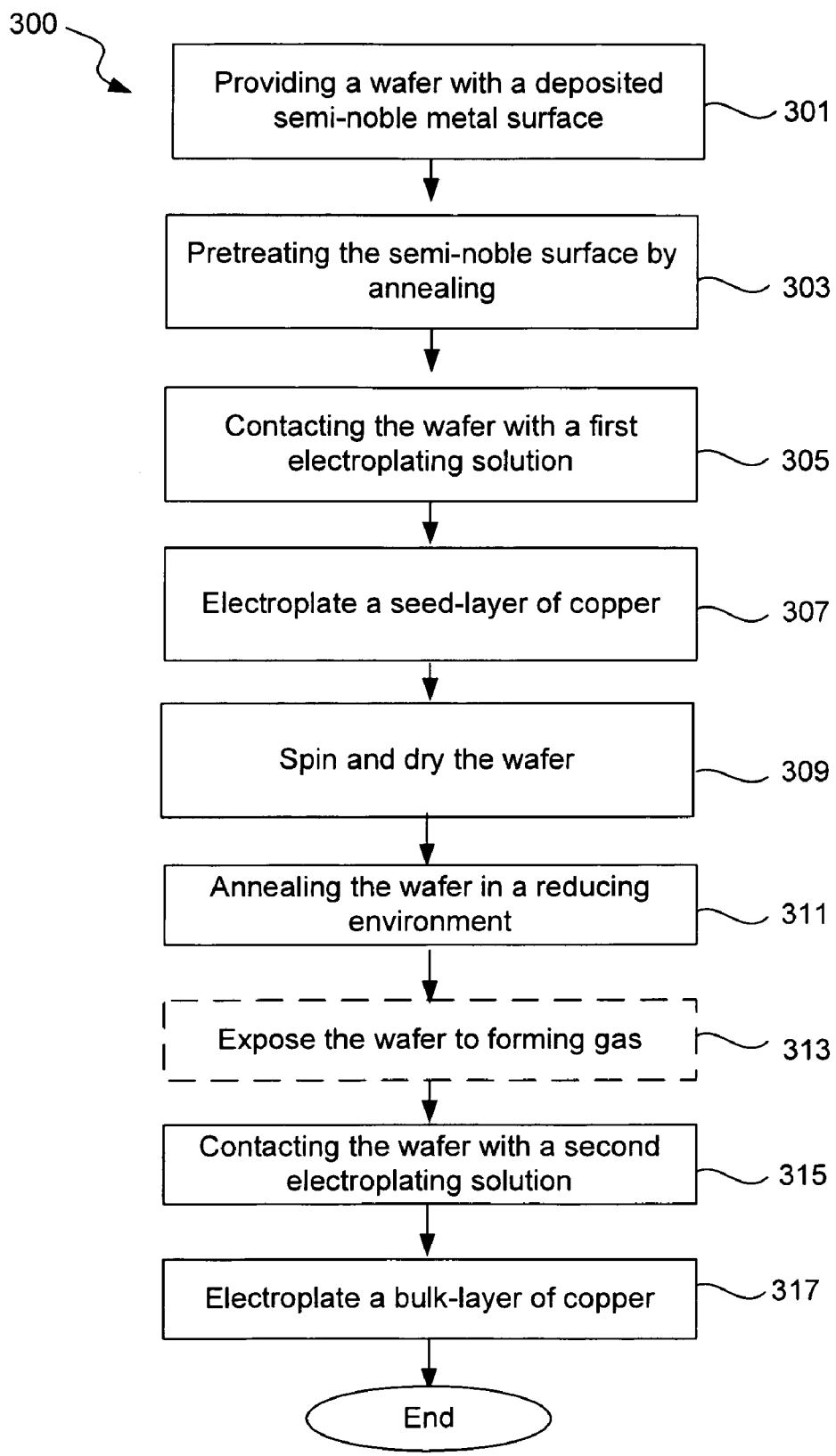
FIG. 3 is a process flow diagram illustrating some embodiments of the method in accordance with the present invention.

In addition to the seed electroplating and the bulk electroplating process described above, other process steps may be included. FIG. 3 is a process flow diagram 300 of one embodiment in accordance with the present invention. A wafer with a semi-noble metal deposited on its surface is provided in operation 301. The wafer may be optionally pretreated by annealing the wafer to a temperature of between about 100-400° C. for a period of between about 1 and 5 minutes. The heat may be applied through a wafer support or a radiant source. During annealing, the wafer may be contacted with forming gas to reduce oxides or to remove contaminants. Forming gas is nitrogen or argon and up to 10% hydrogen. The annealing step 303 may occur in the same semiconductor processing tool as the electroplating steps or in a separate tool.

The wafer is contacted with the first electroplating solution in the first bath in operation 305. The composition and properties of the seed layer electrolyte is described in detail above. A seed layer of copper is deposited onto the wafer as described above at operation 307. Because oxidation of the seed layer is undesirable, contact with the ambient environment is ideally minimized. However, the wafer may be spun, rinsed, and dried in operation 309 in an inert environment or in ambient air. The wafer may then be annealed in accordance with the process disclosed above in operation 311. In operation 313, the wafer may also be exposed to a reducing gas, such as a forming gas during some or all of the anneal process. Thus operation 311 may include operation 313. Then the wafer is contacted with the second electroplating solution 315 and a bulk layer of copper may be deposited onto the wafer using a modified conventional copper electroplating process as described above in operation 317.

Apparatus

Figure 4:
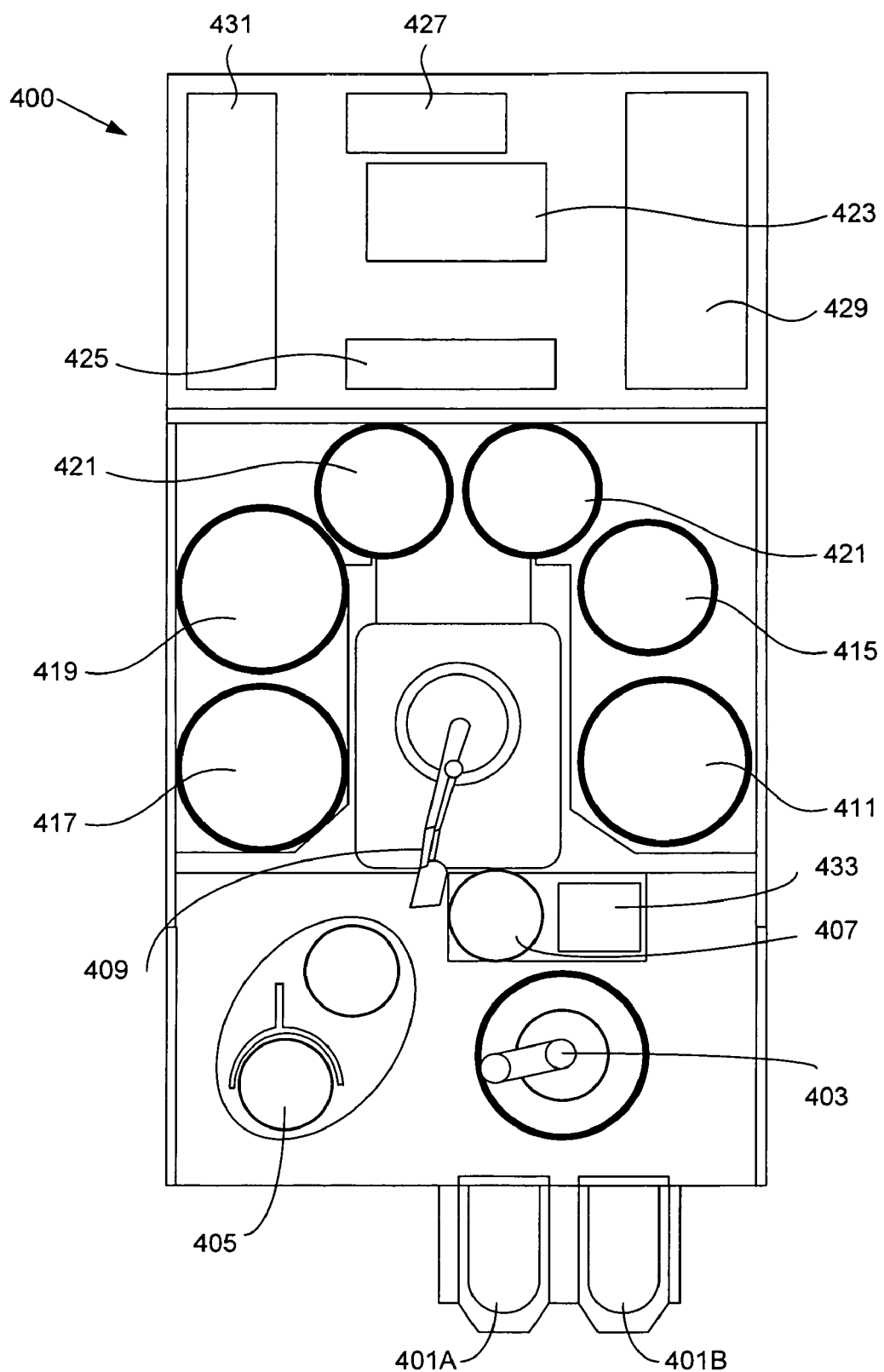
FIG. 4 is a graphical representation of a semiconductor processing apparatus in accordance with one embodiment of the present invention.

The present invention also pertains to the semiconductor apparatus capable of executing the process flow and the process conditions described above. FIG. 4 depicts an electroplating system 400 as an embodiment of one aspect of the present invention. The system includes three separate electroplating or electroplating modules 411, 417 and 419. System 400 also includes three separate post electrofill modules (PEMs) 415 and two 421's. Each PEM may be employed to perform each of the following functions: edge bevel removal, backside etching, acid cleaning, spinning, and drying of wafers after they have been electroplated by one of modules 411, 417 and 419. System 400 also includes a chemical dilution module 425 and a primary electroplating bath 423. This is a tank that holds the chemical solution used as the electroplating bath in the electroplating modules. System 400 also includes a dosing system 427 that stores and delivers chemical additives for the plating bath. A chemical dilution module 425 stores and mixes chemicals to be used as the etchant in the post electrofill modules. A filtration and pumping unit 429 filters the plating solution for central bath 423 and pumps it to the electroplating modules. Finally, an electronics unit 431 provides the electronic and interface controls required to operate system 400. Unit 431 may also provide a power supply for the system.

In operation, an atmospheric robot including a robot arm 403 selects wafers from a wafer cassette or FOUPs (front opening unified pods) such as a cassette 401A or a cassette 401B. Robot arm 403 may attach to the wafer using a vacuum attachment or some other attaching mechanism. The wafer may first be transferred to an annealing station 405 for a pretreatment anneal. Annealing station 405 may be a number of stacked annealing stations, e.g., 5 stacked stations. Annealing stations 405 may be arranged one right on top of each other, in separate stacks, or in other multiple station configurations. To ensure that the wafer is properly aligned on a transfer chamber robot arm 409 for precision delivery to an electrofill module, robot arm 403 transports the wafer to an aligner 407 after the anneal. In certain embodiments, aligner 407 includes alignment pins against which robot arm 403 pushes the wafer. When the wafer is properly aligned against the alignment pins, the robot arm 409 moves to a preset position with respect to the alignment pins. In other embodiments, the aligner 407 determines the wafer center so that the robot arm 409 picks up the wafer from the new position. It then delivers the wafer to an electrofill module such as electrofill module 411 where the copper seed layer is electroplated onto the wafer. Electrofill module 411 may employ electrolyte from a secondary bath (not shown).

After the seed layer electroplating operation completes, robot arm 409 removes the wafer from electrofill module 411 and transports it to one of the PEMs such as module 415. The PEM cleans, rinses, and dries the wafer. The wafer is then again picked up with robot arm 409 and placed in the transfer station 433. The transfer station may be a slot or a position from and to which robot arms 403 and 409 may pass wafers without going through the aligner 407. The robot arm 403 then move the wafer from the transfer chamber, optionally to the cassette, or to one of the anneal stations 405 for the post copper seed anneal. If the wafer is inserted into the cassette, it may be stored for anneal and bulk electroplating at a later time or simply moved to the anneal station. After the copper seed anneal in accordance with the present invention, robot arm 403 moves the wafer back through the aligner 407 and transfer robot 409 to an electrofill module 417 or 419 for bulk electroplating. After the features are filled with copper, the wafer is moved to the PEMs 421. There, unwanted copper from certain locations on the wafer (namely the edge bevel region and the backside) is etched away by an etchant solution provided by chemical dilution module 425. The PEMs 421 also cleans, rinses, and dries the wafer.

After processing in post electrofill modules 421 is complete, robot arm 409 retrieves the wafer from the module and returns it to cassette 401A or 401B. A post electrofill anneal may be completed in system 400 or in another tool. In one embodiment, the post electrofill anneal is completed in one of the anneal stations 405. In other embodiments, dedicated annealing systems such as a furnace may be used. Then the cassettes can be provided to other systems such as a chemical mechanical polishing system for further processing.

Suitable semiconductor processing tools include the Sabre System manufactured by Novellus Systems of San Jose, Calif. or the Slim cell system manufactured by Applied Materials of Santa Clara, Calif., or the Raider tool manufactured by Semitool of Kalispell, Mont.

The Metallization Stack

The metallization stack on a semiconductor wafer made using the methods of the current invention would include a dielectric layer, a semi-noble metal layer, an electroplated and annealed copper seed layer, and a bulk copper layer as viewed from the edge of an copper interconnect to the center of the interconnect. The semi-noble metal layer may be the metal diffusion barrier layer or a portion of a metal diffusion barrier layer. The semi-noble metal layer may be ruthenium, palladium, rhodium, iridium, osmium, cobalt, or nickel. The other portion of a bi-layer metal diffusion barrier may be titanium (Ti), tantalum (Ta), tantalum nitride (TaN), tantalum nitride silicon (TaNSi), tungsten (W), titanium nitride (TiN), or titanium nitride silicon (TiNSi). In the bi-layer configuration, the stack viewed horizontally into the interconnect may include a dielectric layer, a tantalum nitride layer, a semi-noble metal layer, an electroplated and annealed copper seed layer and a bulk copper layer. The semi-noble metal layer may be ruthenium with a thickness of less than 50 angstroms, preferably 20-30 angstroms.

The electroplated and annealed copper seed layer is one aspect of the present invention. As discussed above, the electroplated copper seed layer is more conformal than a PVD seed layer. There are more grains distributed uniformly. The annealed seed layer has an improved copper to semi-noble metal interface such that further stresses, such as those exerted by a post electrofill anneal, do not cause voids to form in the stack.

Figure 5B:
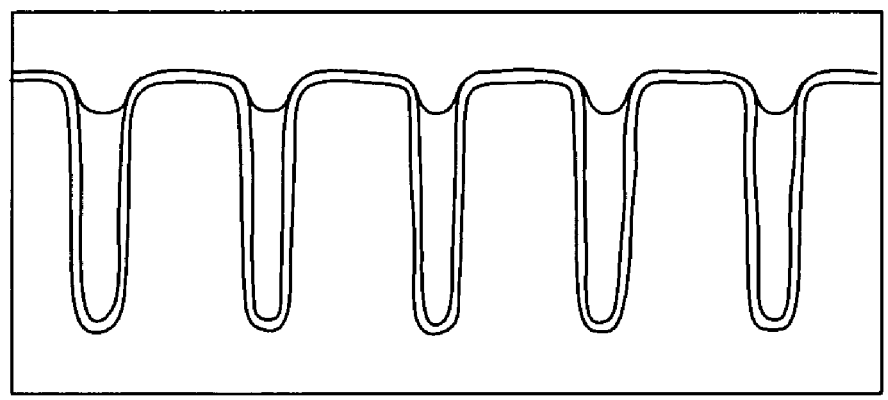

FIGS. 5A and 5B are graphical representations of SEM photo of metallization stacks taken after a post electrofill anneal. FIG. 5A represents a stack with an electroplated copper seed layer with a layer of ruthenium as the semi-noble layer. FIG. 5B represents a stack with an electroplated and annealed copper seed layer. Referring to FIG. 5A, the underlying dielectric is shown as element 509. The barrier layer including ruthenium is shown as layer 511. Various voids, 501, 503, 505, and 507, are indicated in the features at the copper to ruthenium interface.

FIG. 5B shows a metallization stack having the same layers as that of FIG. 5A except for the copper seed layer. The stack of FIG. 5B includes an electroplated and annealed copper seed layer. FIG. 5B includes no voids.

The annealed copper seed layer also has some different electrical properties. In one experiment, 50 angstroms copper seed layer was electroplated onto three wafers having 30 angstroms of ruthenium. These three samples of electroplated copper seed layer were subjected to different annealing conditions. In one case, the seed layer was not annealed. In another case, the seed layer was annealed at 150° C. for 5 minutes. In a third case, the seed layer was annealed at 150° C. for 10 minutes. The sheet resistance of each seed layer was measured.

| Electroplated Copper Seed Layer Thickness (angstroms) | Anneal Conditions | Sheet Resistance (Ω/square) |
|---|---|---|
| 50 | None | 35.5 |
| 50 | 150° C./5 minutes | 31.5 |
| 50 | 150° C./10 minutes | 31.6 |

A sheet resistance is a measure of resistance of thin films that have a uniform thickness and has the unit of u/square. As discussed above, a lower sheet resistance indicates less voltage drop across a wafer during electroplating. Sheet resistance is also an indication of the quality of interface between the ruthenium and copper seed layer. As shown after annealing for 5 minutes, sheet resistance decreases. However, more annealing (10 minutes) did not seem to affect the sheet resistance. The data shows that as compared to an unannealed seed layer, the annealed seed layer has better adhesion and stability as shown by the lower sheet resistance. The data also shows that the sheet resistance improvement appears to be a step function at the level investigated. More anneal does not seem to affect the sheet resistance.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A semiconductor processing method for depositing copper comprising:
   providing a semiconductor wafer having a semi-noble metal layer thereon;
   depositing a seed layer of copper onto the metal layer using an electroplating process with a first electrolyte comprising a copper salt and a copper complexing agent, wherein the resistivity of the first electrolyte is at least about 200 ohms cm, thereby promoting a generally uniform deposition rate across a plating surface of the wafer, and wherein depositing the seed layer comprises applying a current waveform, comprising:
   a first step of applying a forward direct current for a first duration,
   a second step of alternating forward and reverse current pulses for a second duration, and
   a third step of applying a forward direct current for a third duration, wherein substantially all of the copper seed layer is deposited during the third step;
   annealing the seed layer; and
   depositing a bulk-layer of copper onto the annealed seed layer of copper using an electroplating process employing a second electrolyte.

2. The method of claim 1, wherein the annealing is performed in the presence of forming gas, plasma, or other reducing atmosphere.

3. The method of claim 1, wherein the annealing temperature is about 100 to 400° C.

4. The method of claim 1, wherein the annealing temperature is about 100 to 200° C.

5. The method of claim 1, wherein the annealing temperature is about 150° C.

6. The method of claim 1, wherein the wafer is annealed for a period of between about 10 and 1000 seconds.

7. The method of claim 1, wherein the wafer is annealed for a period of between about 300 and 900 seconds.

8. The method of claim 1, wherein the wafer is annealed for a period of about 120 seconds.

9. The method of claim 1, further comprising:
   pretreating the semi-noble metal layer by annealing.

10. The method of claim 1, wherein the resistivity of the first electrolyte is about 1000-2000 ohms cm.

11. The method of claim 1, wherein the complexing agent in the first electrolyte is EDTA, citrate, pyrophosphate, oxalate, triethanolamine, dimercaptosuccinic acid, nitrilotriacetate, dimercaprol, desfuroxamine mesylate or combinations thereof.

12. The method of claim 1, wherein the copper salt is copper citrate, copper pyrophosphate, or copper oxalate.

13. The method of claim 1, wherein the first electrolyte causes a copper plating reaction to occur at a potential of about −0.8 to −2.0 volts.

14. The method of claim 1, wherein the first electrolyte causes a copper plating reaction to occur at a potential that is about 200-1000 millivolts more cathodic than would occur in a conventional copper-plating electrolyte.

15. The method of claim 1, wherein the seed layer of copper deposited has a thickness of about 15-60 angstroms.

16. The method of claim 1, wherein the reverse current pulse strips off substantially all of the copper deposited during the forward current pulse of the second step.

17. The method of claim 1, wherein the forward direct current of the first step is between about 0.6-1.0 amps for a period of about 0.5-2 seconds.

18. The method of claim 1, wherein the forward direct current of the third step is between about 0.6-1.0 amps, and the third duration is about 10-22 seconds to deposit a 30-70 angstrom seed layer.

19. The method of claim 1, wherein the semi-noble metal is ruthenium, palladium, rhodium, iridium, osmium, cobalt, or nickel.

20. The method of claim 1, wherein the semi-noble metal layer serves as at least a portion of a diffusion barrier.

21. The method of claim 1, wherein the depositing a seed layer operation is performed in a first electroplating module and the depositing a bulk-layer operation is performed in a second electroplating module.

22. The method of claim 1 wherein the copper salt in the first electrolyte is different from a copper salt of the second electrolyte.

23. The method of claim 16, wherein based on a 300 mm wafer, the forward current pulse of the second step is between about 0.6-0.9 amps for a period of about 700-1500 millisecond; the reverse current pulse is about 0.2-0.5 amps for a period of about 400-600 millisecond; and, the second duration is about 8-15 seconds.

24. The method of claim 21, wherein the annealing the seed layer operation is performed in an annealing station in the same semiconductor processing tool as the first and second electroplating modules.

25. A method for depositing a copper seed layer comprising:
   providing a semiconductor wafer having a semi-noble metal layer thereon;
   applying forward and reverse current pulses to the metal layer using a process with an electrolyte to treat the metal layer and thereby improve copper seed layer nucleation and coverage, wherein the electrolyte comprises a copper salt and a copper complexing agent, wherein the reverse current pulse strips off substantially all of the copper deposited during the forward current pulse; and
   depositing the copper seed layer onto the metal layer using an electroplating process with the electrolyte by applying a forward current.

26. The method of claim 25, wherein when applying the forward and reverse current pulses to the metal layer, a first pulse is a forward current pulse.

27. The method of claim 25, wherein when applying the forward and reverse current pulses to the metal layer, a first pulse is a reverse current pulse that treats the metal layer.

28. The method of claim 25, wherein applying the forward and reverse current pulses comprises applying multiple forward and reverse current pulse pairs.

29. The method of claim 25, further comprising:
   depositing a bulk-layer of copper onto the copper seed layer using an electroplating process with a second electrolyte.

* * * * *